(12) United States Patent
Chen

(10) Patent No.: US 7,362,569 B2
(45) Date of Patent: Apr. 22, 2008

(54) FAN BEARER

(75) Inventor: Kuei-Hua Chen, Taipei (TW)

(73) Assignee: Inventec Corporation (TW)

( * ) Notice: Subject to any disclaimer, the term of this patent is extended or adjusted under 35 U.S.C. 154(b) by 194 days.

(21) Appl. No.: 11/395,065

(22) Filed: Mar. 30, 2006

(65) Prior Publication Data

US 2007/0053160 A1 Mar. 8, 2007

(30) Foreign Application Priority Data

Sep. 7, 2005 (TW) .............................. 94215367 U

(51) Int. Cl.
*H05K 7/20* (2006.01)

(52) U.S. Cl. ...................... 361/687; 165/80.3; 454/129; 361/695

(58) Field of Classification Search .................. 454/69, 454/78, 129, 136; 165/80.3, 185, 122; 114/211; 361/695–697, 679–687, 724–727

See application file for complete search history.

(56) References Cited

U.S. PATENT DOCUMENTS

| | | | | |
|---|---|---|---|---|
| 5,884,692 A | * | 3/1999 | Lee et al. | 165/80.3 |
| 6,362,958 B1 | * | 3/2002 | Yu et al. | 361/687 |
| 7,201,110 B1 | * | 4/2007 | Pawlak | 114/211 |
| 2005/0280991 A1 | * | 12/2005 | Tsai | 361/697 |
| 2007/0146991 A1 | * | 6/2007 | Chen et al. | 361/695 |

* cited by examiner

*Primary Examiner*—Hung Van Duong
(74) *Attorney, Agent, or Firm*—Peter F. Corless; Steven M. Jensen; Edwards Angell Palmer & Dodge LLP

(57) ABSTRACT

A fan bearer used to bear a fan and able to be detachably mounted on a base is proposed. The fan bearer includes a bearer body for bearing the fan, and at least two loading/unloading components accommodated in at least two accommodation spaces of the bearing body respectively. Each of the loading/unloading components includes a first spring portion, a first hitching portion, a latch portion extended from the first hitching portion, and a second spring portion installed against an inner wall of the accommodation space. The base includes a withstanding portion and a second hitching portion corresponding to the first spring portion and the first hitching portion respectively. By a series of appropriate operations, the fan bearer can be fixed to or detached from the base.

13 Claims, 9 Drawing Sheets

FAN BEARER

BACKGROUND OF THE INVENTION

1. Field of the Invention

The present invention relates generally to a fan bearer, and more particularly, to a fan bearer applicable in a computer for bearing a fan of the computer.

2. Description of Related Art

With rapid progress of the high-speed computer, heat produced by various electronic components such as a central processing unit (CPU) and integrated circuit (IC) in the computer has been becoming much higher, thus a fan has been widely applied in the computer for ventilate beat generated by the CPU to a region outside of a case of the computer. Moreover, Intel chief technology officer (CTO) Patrick Gelsinger has indicated in the Intel developer forum (IDF) that with the increasing popularity of information, and with the increase of the processing information amount, there is no doubt that speed of the processor will be upgraded in the future, correspondingly, heat dissipation and low power expenditure will be an important issue for the developer related to computer in the next ten years. Therefore, heat dissipation plays an important part in the electronic components.

If the electronic components of a computer are operated under high temperature, the computer will become unstable or be hung up. Thus, in order to enable the electronic components to operate stably and normally, heat produced by the electronic components must be dissipated efficiently and quickly. Typically, the most direct heat dissipating manner is to mount heat sinks or fans on the electronic components, so the heat produced by the electronic components can be quickly conducted to the heat sinks, or be brought away through fan convection, thereby dissipating the heat.

However, the fan used in a computer can not dissipate heat unless it is integrated into a case of the computer. Presently, the common method is to mount the fan on a fan stand, by combination of a first assembling structure disposed at the fan stand and a second assembling structure disposed corresponding to the first assembling structure at the case of the computer. Therefore, the fan of the computer can be fixed to the case of the computer.

The above first assembling structure disposed at the fan stand and the second assembling structure disposed at the case of the computer are typically designed in the fixing concept of a latch, i.e., cooperation of a bulge and an engaging slot is employed for fixing. However, there must be two groups of the above structures according to the existing structure of the fan stand under such a design to complete fixing. Therefore, a user must unload or load the fan stand with both hands, which results in inconvenience for the user. In addition, material of the structure designed in the fixing concept of a latch is generally plastic material. Thus, when unloading or loading, the bulge and the engaging slot may be honed against each other, then the bulge and the engaging slot may be frayed and produced a gap after a long time, which affects fixing the fan stand to the case. Furthermore, the fan of the computer are fixed to the case of the computer in the above manner, so the bulge can not reach the designated position and can not be engaged with the engaging slot fully, thereby causing looseness and even deviation of the fans from the case.

Accordingly, there exists a strong need in the art for an assembling structure of a fan stand, so that unloading and loading operation can be performed with one hand, and drawbacks such as abrasion and incomplete engagement can be prevented.

SUMMARY OF THE INVENTION

Accordingly, it is an objective of the present invention to solve the drawbacks of the above prior art by providing a fan bearer which can be loaded or unloaded with one hand, so as to enhance the application convenience.

It is another objective of the present invention to provide a fan bearer which prevents the fan bearer from fraying and engaging incompletely.

In order to attain the object mentioned above and the others, a fan bearer is provided according to the present invention. The fan bearer is used for bearing a fan and capable of being detachably mounted on a base. The fan bearer includes a bearer body for bearing the fan, the bearer body having at least two accommodation spaces; and at least two loading/unloading components accommodated in the accommodation spaces respectively, each of the loading/unloading components comprising a first spring portion, a first hitching portion, a latch portion extended from the first hitching portion, and a second spring portion installed against an inner wall of a corresponding one of the accommodation spaces, the base comprising a withstanding portion and a second hitching portion corresponding to the first spring portion and the first hitching portion respectively; wherein when the fan bearer is placed on the base and pressed to move toward the base, the withstanding portion withstands the loading/unloading component, enabling the loading/unloading component to slide to a predetermined position where the first hitching portion corresponds to the second hitching portion so that the first hitching portion is hitched to the second hitching portion, the second spring portion withstanding the inner wall of the accommodation space and staying in a compression state until the first hitching portion is hitched to the second hitching portion, when the second spring portion is released and a second resilient force generated by the released second spring enables the loading/unloading component to stay in a decompression state, the second hitching portion to be engaged with the latch portion, and the fan bearer to be mounted on the base; when the loading/unloading component is pressed, the withstanding portion withstands the loading/unloading component, enabling the second hitching portion to move away from the latch portion and slide to the predetermined position, and the first spring portion to stay in the compression state, and when the loading/unloading component is released and stays in the decompression state, the first spring portion is released and a first resilient force generated by the released first spring portion enables the first hitching portion to be separated from the second hitching portion so that the fan bearer is detached from the base.

Compared with the prior art, the present invention adopts a design of the above loading/unloading component and base to achieve the above main and the other objectives.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

With reference to FIGS. 1, 2, 3A to 3D, and 4A to 4C, shown are the drawings related to a fan bearer according to the present invention. The preferred embodiments of the fan bearer according to the present invention will be described fully in conjunction with the drawings. It should be noted that the drawings are all simplified schematic diagrams and merely illustrate a basic structure according to the present invention. In such drawings, they merely illustrate the components pertaining to the present invention, and the illustrated components may not be drawn according to number, shape and size proportion of the components implemented actually, number, shape or size proportion of the components when actually implementing is a selective design, the layout of the components may be more complex.

Figure 1:
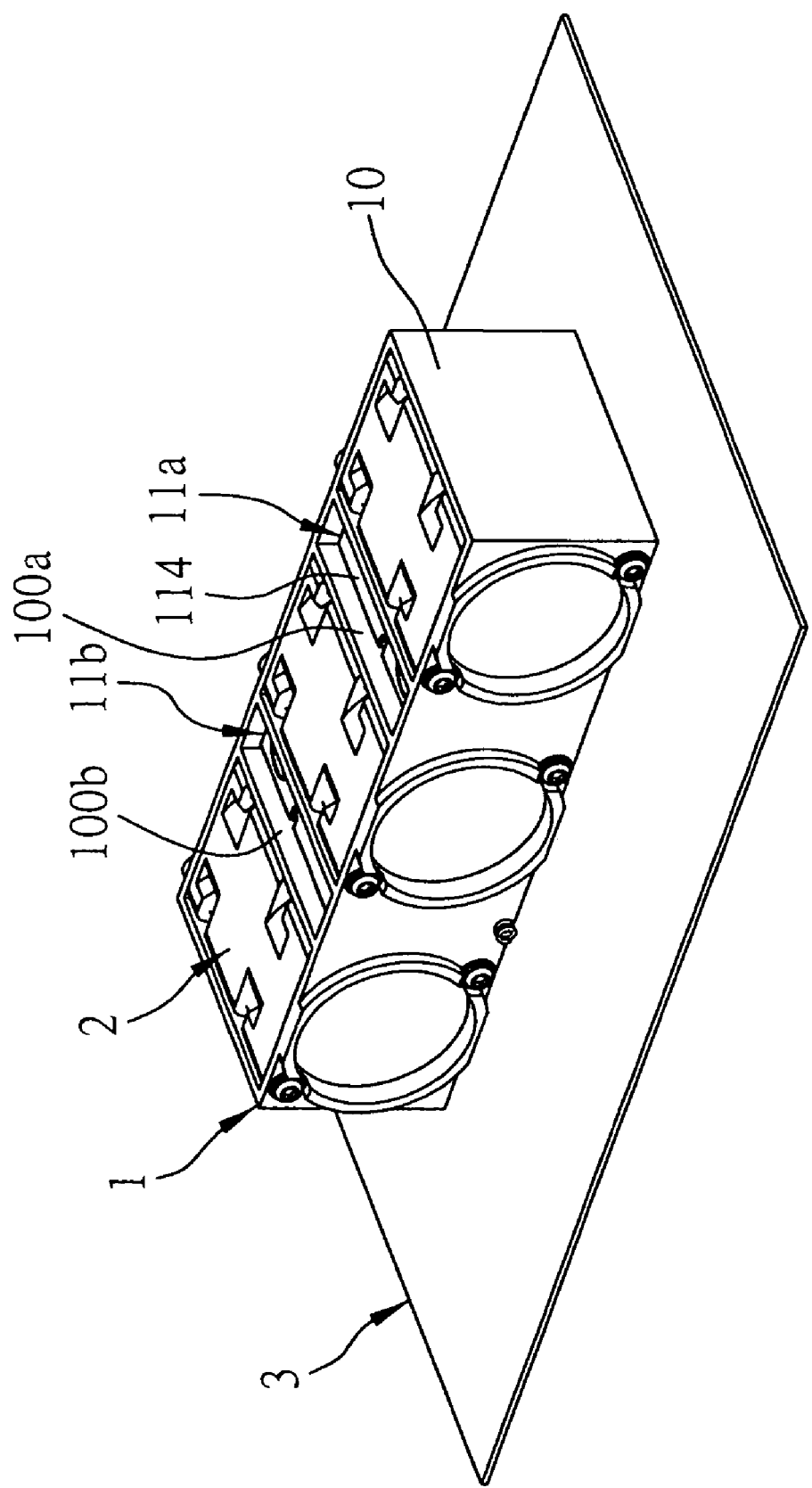
FIG. 1 depicts an apparent schematic diagram of an appearance of a fan bearer according to the present invention.
Figure 2:
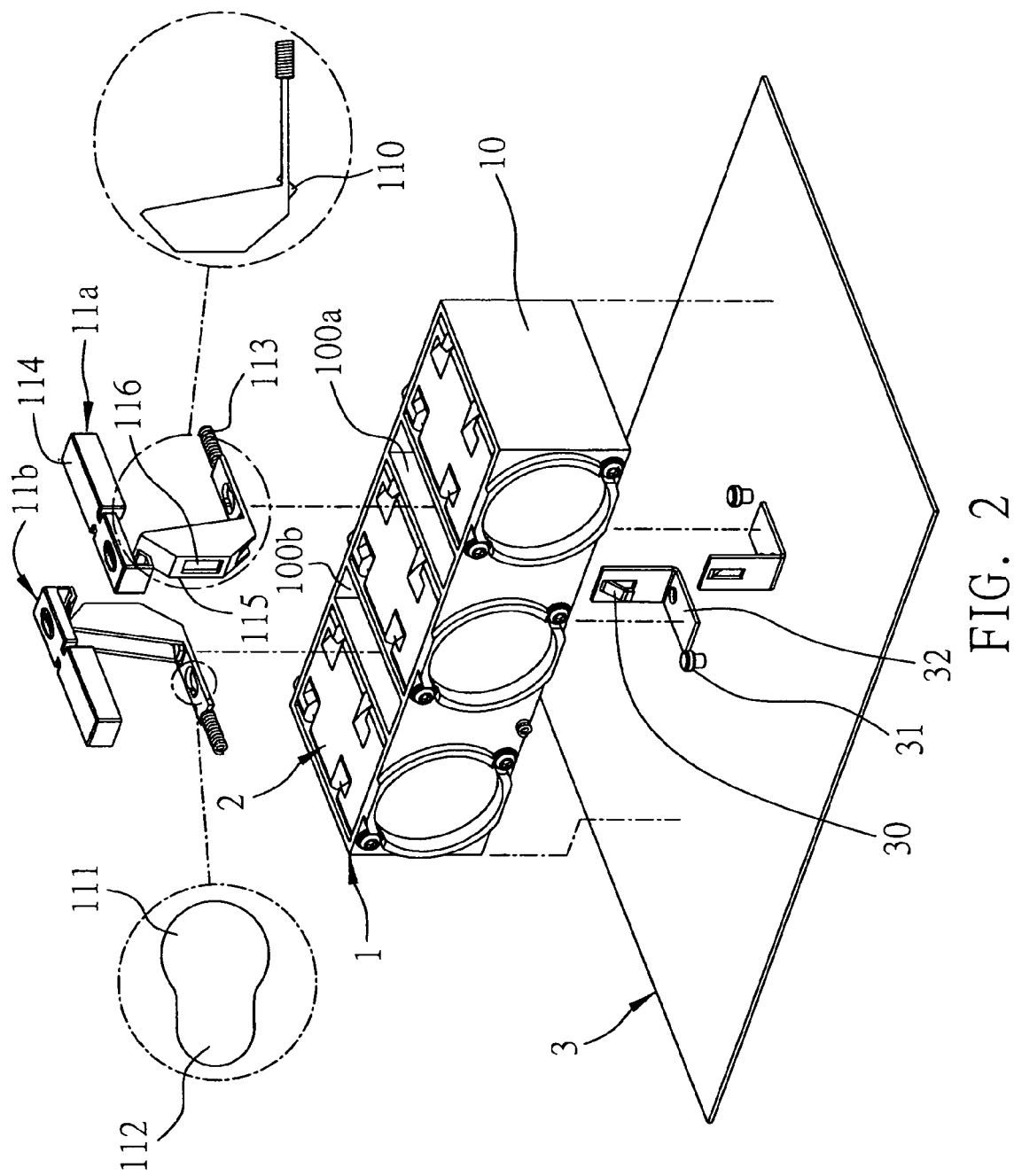
FIG. 2 depicts an exploded schematic diagram of the exploded state of a fan bearer according to the present invention.

FIG. 1 is an assembly schematic diagram of a base 3, a fan bearer 1 installed on the base 3, and a fan 2 bore by the fan bearer 1 of the preferred embodiment according to the present invention, FIG. 2 is an explosive view of the base 3, the fan bearer 1 and the fan 2 when the fan bearer 1 is detached from the base 3. The fan bearer 1 is suitable for a fan 2 (such as a cooling fan used in a desktop computer, a palm computer, a notebook computer, a super computer and a server computer). The fan bearer 1 is used to bear the fan 2, and can be fixed to or detached from the base 3 such as a case of a computer. The fan bearer 1 comprises a bearer body 10 for bearing the fan 2 and two loading/unloading components 11a and 11b, both of which are engaged with the bearer body 10.

The bearer body 10 is provided with two accommodation spaces 100a and 100b for accommodation of the loading/unloading components 11a and 11b respectively.

Each of the loading/unloading components 11a and 11b (the loading/unloading component 11b as an exemplary) comprises a first spring portion 110 (as shown in an enlarged view in FIG. 2, the first spring portion 110 is for example a spring component such as a spring piece), a first hitching portion 111, a latch portion 112 extended from the first hitching portion 111, and a second spring portion 113 installed against an inner wall of the accommodation space 100b. A withstanding portion 30 and a second hitching portion 31, which correspond to the first spring portion 110 and the first hitching portion 111 respectively, are installed on the base 3. According to the preferred embodiment, each of the loading/unloading components 11a and 11b further comprises a press member 114 such as a gland bush for a pressing force to be applied to, and a slippage member 115 such as a sliding pin disposed corresponding to the press member 114. The slippage member 115 has the first spring portion 110, the first hitching portion 111, the latch portion 112, and the second spring portion 113.

The slippage member 115 is further provided with a position hole 116 corresponding to the withstanding portion 30. Preferably, the first hitching portion 111 is a trepan boring, the latch portion 112 is a slot extended from the trepan boring, and the second hitching portion 31 is a stud. A base portion 32 corresponding to the base 3 and the first spring portion 110 is extended from the withstanding portion 30, and the withstanding portion 30 and the base portion 32 can be made if the form of a guidance plate as shown in FIG. 2.

Figure 3A:
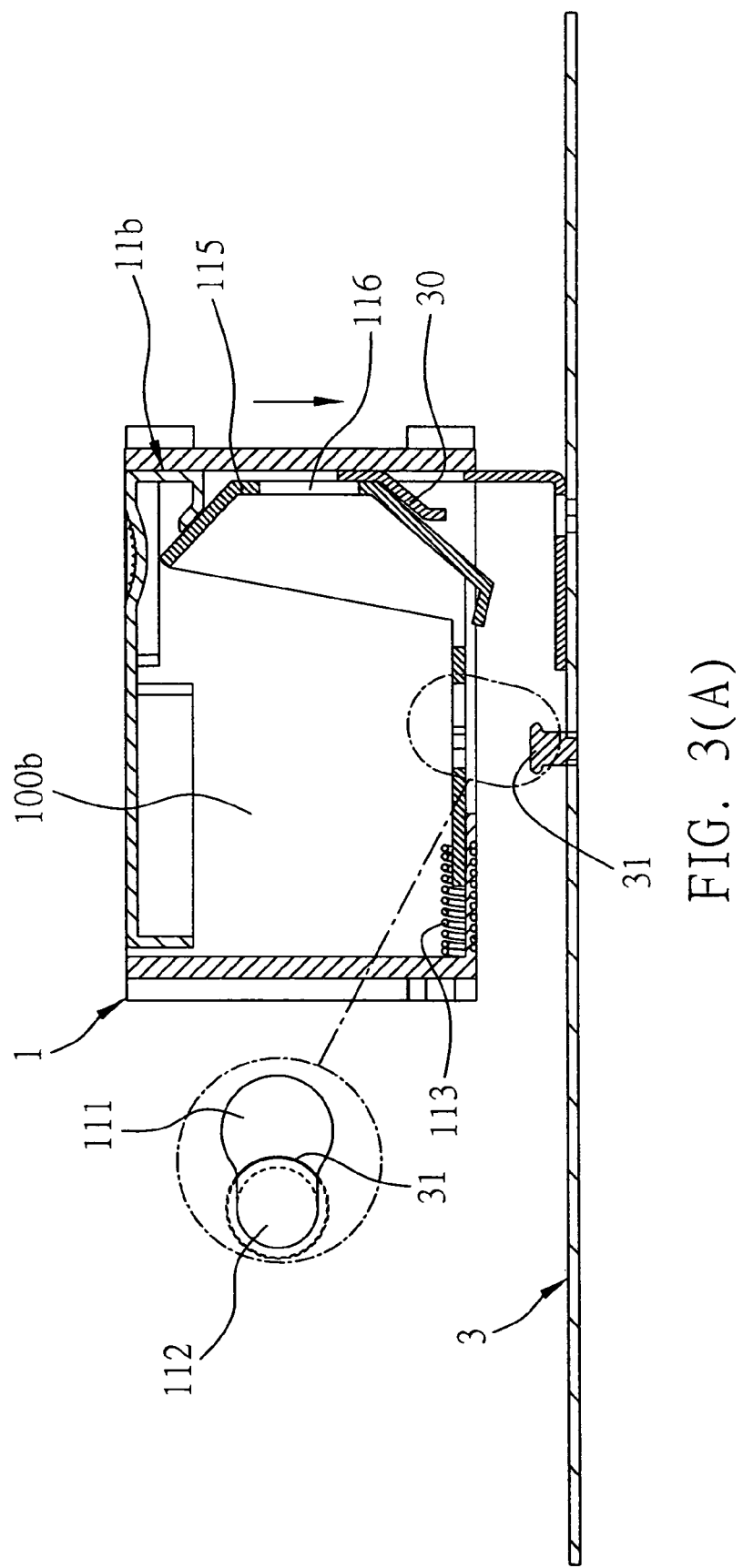
FIGS. 3A to 3D depict four cross-sectional views of the operations for loading a fan bearer according to the present invention.
Figure 3B:
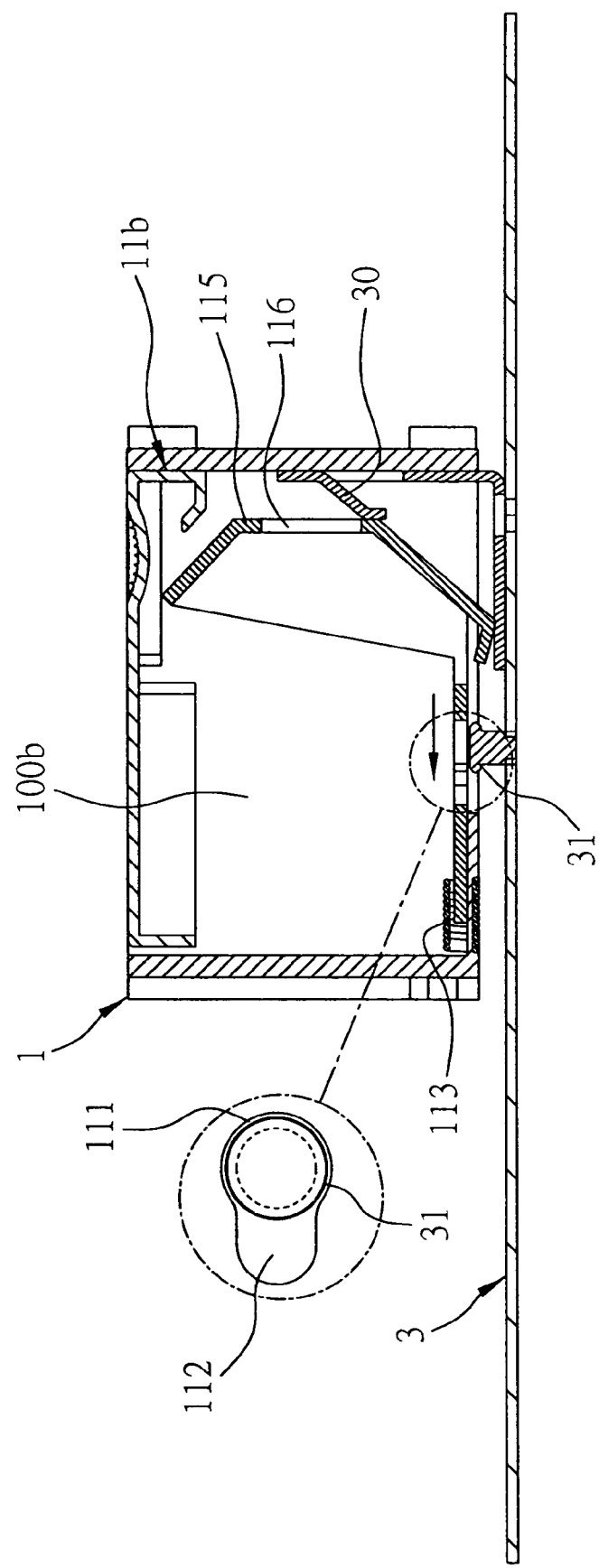
Figure 3C:
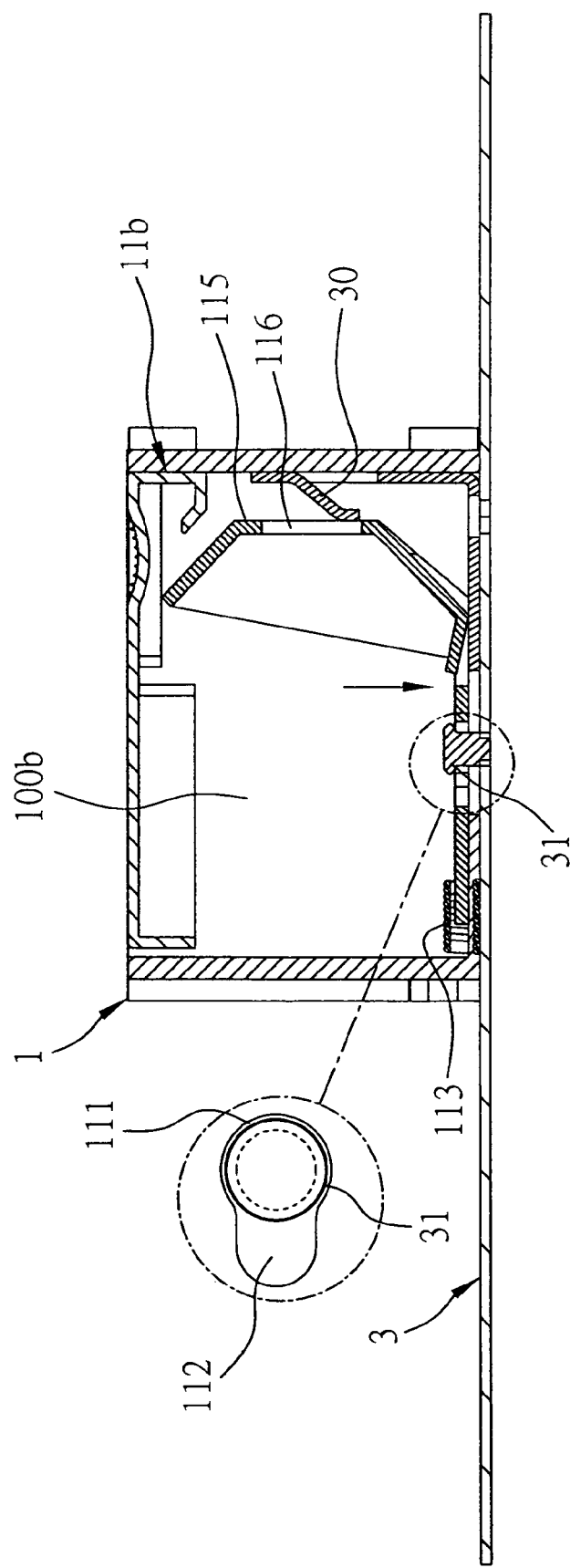
Figure 3D:
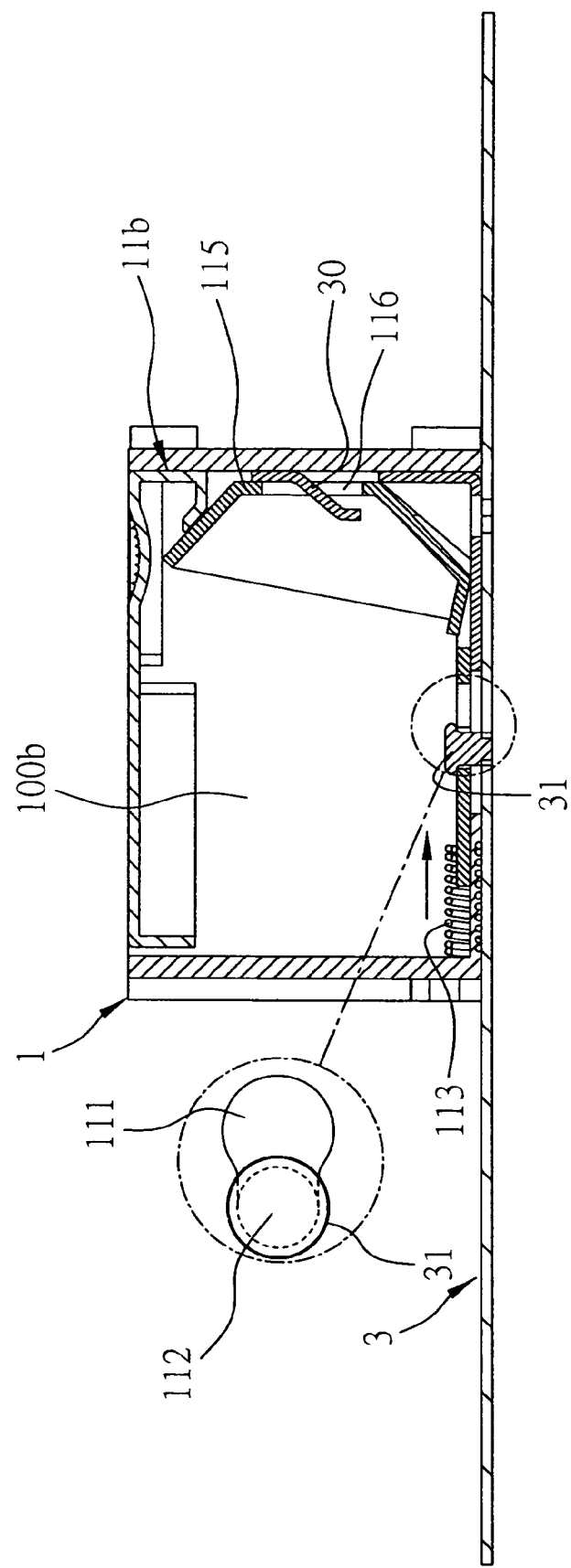

FIGS. 3A to 3D are four assembly states illustrating how the fan bearer 1 is fixed to the base 3 according to the present invention. First, the fan bearer 1 is pressed toward the base 3, during when the withstanding portion 30 of the base 3 is to withstand the slippage member 115 (as shown in FIG. 3B) of the loading/unloading component 11b (according to the preferred embodiment, both of loading/unloading components 11a and 11b have identical operational manners, so only one, i.e. the loading/unloading component 11b, is used here to illustrate how the fan bearer 1 is fixed to the base 3), so as to enable the slippage member 115 of the loading/unloading component 11b slide to a position where the first hitching portion 111 of the slippage member 115 corresponds to the second hitching portion 31 of the base 3 and the first hitching portion 111 to be engaged with the second hitching portion 31 (as shown in FIG. 3C). When the first hitching portion 111 is about to be hitched to the second hitching portion 31, the second spring portion 113 of the slippage member 115 is withstanding the inner wall of the accommodation space 100b and is in compression state (as shown in FIGS. 3B and 3C). Then, after the first hitching portion 111 is hitched to the second hitching portion 31 completely, as shown in FIG. 3D, the second spring portion 113 enables the loading/unloading component 11b to be released from the withstanding of the withstanding portion 30 of the base 3 with a resilient force resulted from the compression state's returning to a decompression state. In the meantime, the position hole 16 is engaged with the withstanding portion 30, and the second hitching portion 31 has entered into the latch portion 112 extended from the first hitching portion 111, so as to fix the fan bearer 1 to the base 3. The engaging movement of the position hole 116 and the withstanding portion 30 provides a guiding and a much more preferable positioning effects for the slippage member 115.

Figure 4A:
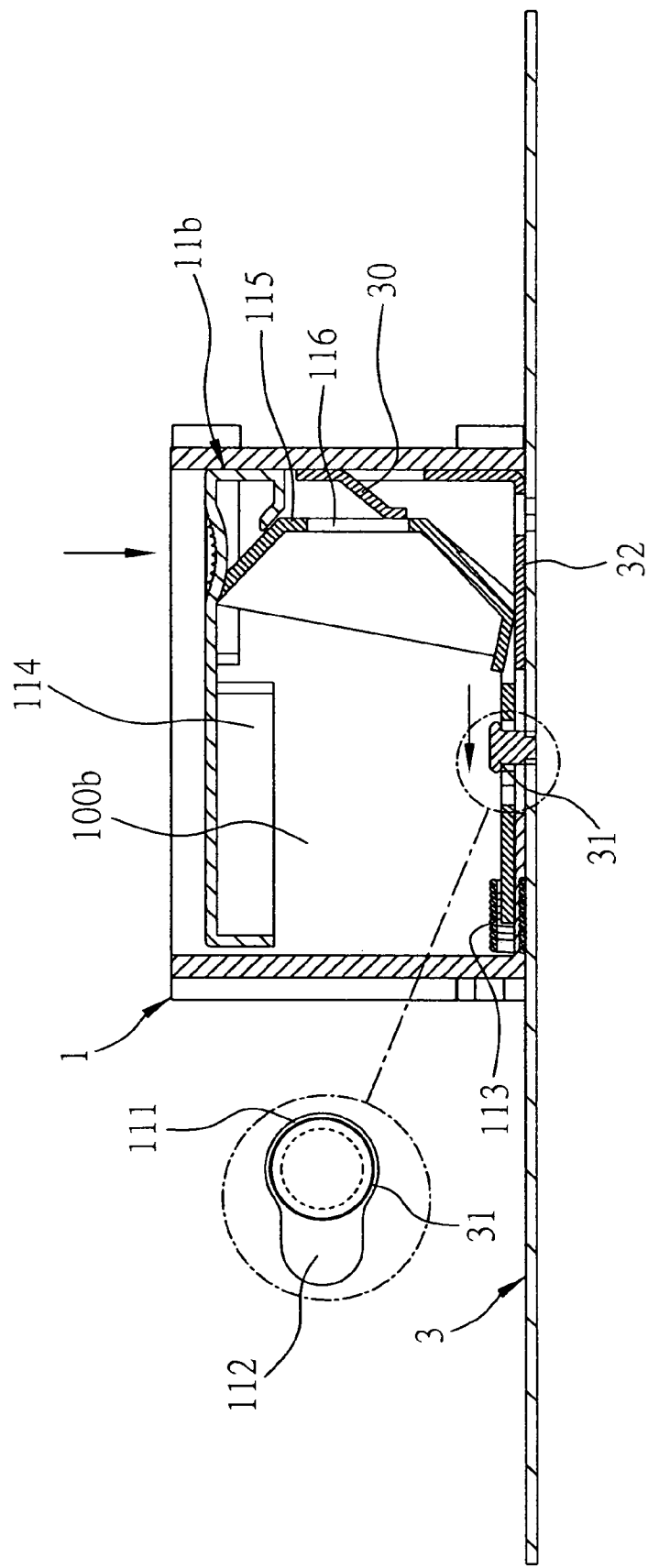
FIGS. 4A to 4C depict another four cross-sectional views of the operations for unloading a fan bearer according to the present invention.
Figure 4B:
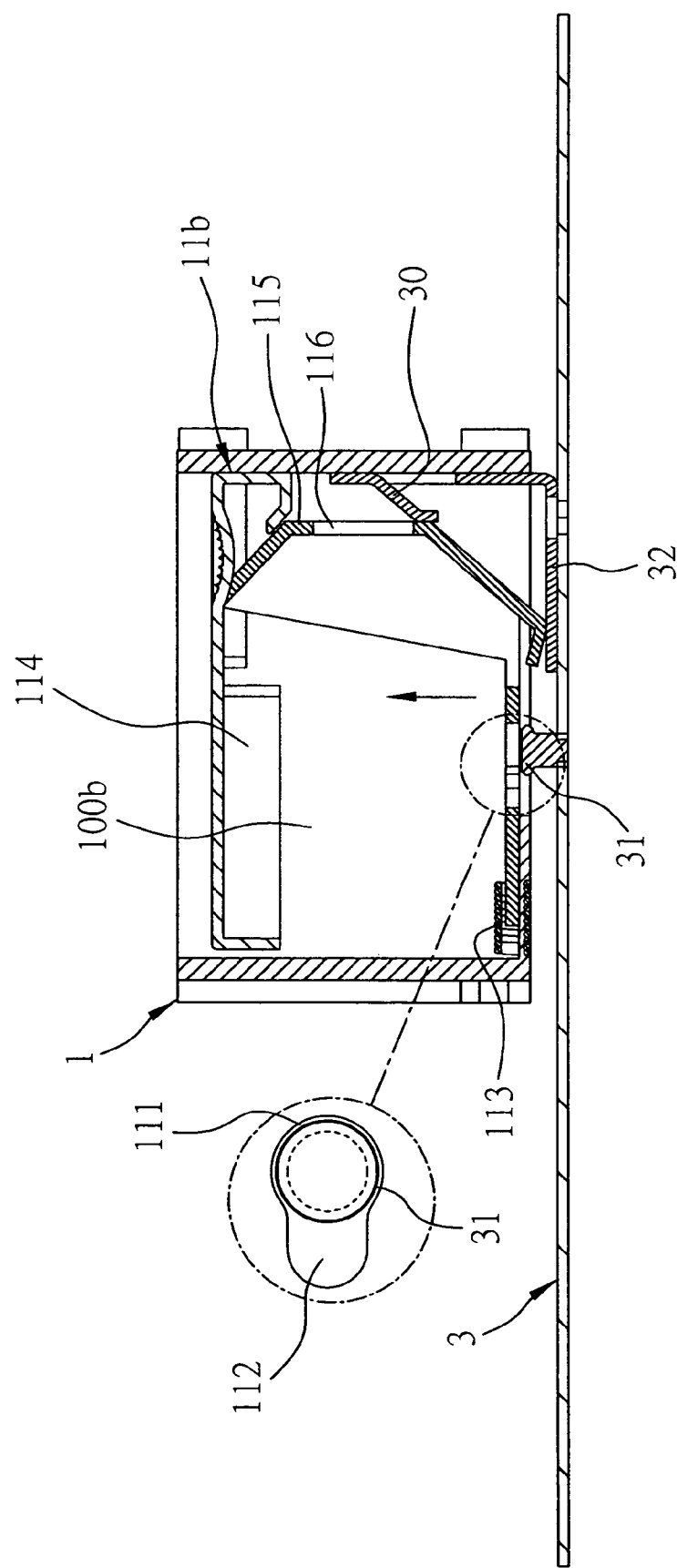
Figure 4C:
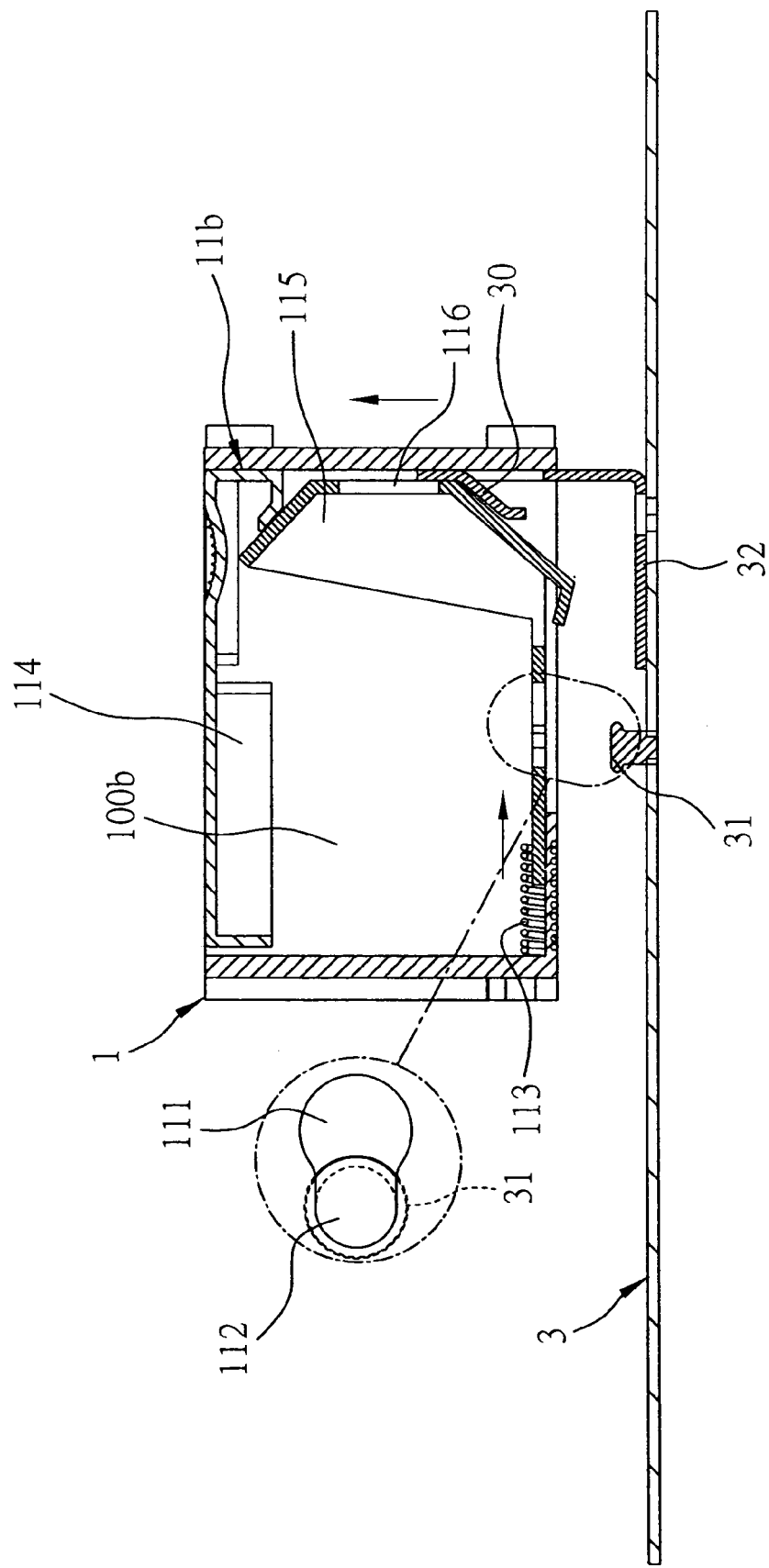

FIGS. 4A to 4D are four assembly states illustrating how the fan bearer 1 is detached from the base 3 according to the present invention. First, as shown in FIG. 4A, the press member 114 of the loading/unloading component 11b is pressed by a pressing force to allow the withstanding portion 30 of the base 3 to withstand the slippage member 115 of the loading/unloading component 11b, so as to push the second hitching portion 31 away from the latch portion 112 and enable the second hitching portion 31 to slide to the position where the first hitching portion 111 corresponds to the second hitching portion 31. The first spring portion 110 of the slippage member 115 is corresponding to the base portion 32 extended from the withstanding portion 30 of the base 3 and is therefore in the compression state. Then, as shown in FIGS. 4B and 4C, release the press member 114 of the loading/unloading component 11b from the pressing force, and the first spring portion 110 therefore enables the loading/unloading component 11b to be released from the pressing force and further enables the second hitching portion 31 to be detached from the first hitching portion 111 with the resilient force, so as to unload (or detach) the fan bearer 1 from the base 3.

The technical features and the exemplary manners according to the present invention can be clearly understood from the above description accompanying with the drawings, through the structure design such as a bearer body for bearing the fans and at least two loading/unloading components disposed inside the accommodation spaces of the bearing body, a user can load or unload the fan bearer with one hand, so as to provide convenience in operation for the user, and also prevent the fan bearer from fraying and engaging incompletely occurred in the prior art.

The above-described exemplary embodiments are to describe various objects and features of the present invention as illustrative and not restrictive. A person of ordinary skilled in the art would recognize that modifications and changes could be made in form and detail without departing from the sprit and the scope of the invention. Thus, the right protective scope of the present invention should fall within the appended claim.

What is claimed is:

1. A fan bearer for bearing a fan and capable of being detachably mounted on a base, the fan bearer comprising:
    a bearer body for bearing the fan, the bearer body having at least two accommodation spaces; and
    at least two loading/unloading components accommodated in the accommodation spaces respectively, each of the loading/unloading components comprising a first spring portion, a first hitching portion, a latch portion extended from the first hitching portion, and a second spring portion installed against an inner wall of a corresponding one of the accommodation spaces, the base comprising a withstanding portion and a second hitching portion corresponding to the first spring portion and the first hitching portion respectively;
    wherein when the fan bearer is placed on the base and pressed to move toward the base, the withstanding portion withstands each of the loading/unloading components, enabling each of the loading/unloading components to slide to a predetermined position where the first hitching portion corresponds to the second hitching portion so that the first hitching portion is hitched to the second hitching portion; the second spring portion withstands the inner wall of the accommodation space and stays in a compression state until the first hitching portion is hitched to the second hitching portion where the second spring portion is released and a second resilient force generated by the released second spring enables each of the loading/unloading components to stay in a decompression state, the second hitching portion to be engaged with the latch portion, and the fan bearer to be mounted on the base; when each of the loading/unloading components is pressed, the withstanding portion withstands each of the loading/unloading components, enabling the second hitching portion to move away from the latch portion and slide to the predetermined position, and the first spring portion to stay in the compression state, and when each of the loading/unloading component is released and stays in the decompression state, the first spring portion is released and a first resilient force generated by the released first spring portion enables the first hitching portion to be separated from the second hitching portion so that the fan bearer is detached from the base.

2. The fan bearer of claim 1, each of wherein the loading/unloading components comprises a press member for applying a pressing force, and a slippage member corresponding to the press member, the slippage member having the first spring portion, the first hitching portion, the latch portion and the second spring portion.

3. The fan bearer of claim 2, wherein the slippage member comprises a position hole corresponding to the withstanding portion, for being engaged with the withstanding portion after the fan bearer is mounted on the base, so as to provide a guiding effect and a preferable fixing effect for the slippage member.

4. The fan bearer of claim 2, wherein the press member is a gland bush, and the slippage member is a sliding pin.

5. The fan bearer of claim 1, wherein the first spring portion comprises a spring component.

6. The fan bearer of claim 5, wherein the spring component is a leaf spring.

7. The fan bearer of claim 1, wherein the second spring portion comprises a spring component.

8. The fan bearer of claim 7, wherein the spring component is a spring.

9. The fan bearer of claim 1, wherein the first hitching portion is a trepan boring, the latch portion is a slot extended from the trepan boring, and the second hitching portion is a stud.

10. The fan bearer of claim 1 further comprising a base portion extended from the withstanding portion and corresponding to the base and the first spring portion, for withstanding the first spring portion when the fan bearer is to be detached from the base and each of the loading/unloading components is pressed, so as to enable the first spring portion to stay in the compression state.

11. The fan bearer of claim 10, wherein the withstanding portion and the base portion are formed of a guidance plate.

12. The fan bearer of claim 1, wherein the fan is a cooling fan applied in a computer, and the base is a case of the computer.

13. The fan bearer of claim 12, wherein the computer is one selected from the group consisting of a desktop computer, a palm computer, a notebook computer, a super computer and a server computer.

* * * * *